(12) United States Patent
Barbe et al.

(10) Patent No.: US 7,579,226 B2
(45) Date of Patent: Aug. 25, 2009

(54) THIN LAYER ELEMENT AND ASSOCIATED FABRICATION PROCESS

(75) Inventors: Jean-Charles Barbe, Grenoble (FR); Maud Vinet, Grenoble (FR); Olivier Faynot, Seyssinet-Pariset (FR)

(73) Assignee: Commissariat a l'Energie Atomique, Paris (FR)

( * ) Notice: Subject to any disclaimer, the term of this patent is extended or adjusted under 35 U.S.C. 154(b) by 564 days.

(21) Appl. No.: 11/211,255

(22) Filed: Aug. 19, 2005

(65) Prior Publication Data
US 2006/0060846 A1 Mar. 23, 2006

(30) Foreign Application Priority Data
Aug. 19, 2004 (FR) .................................. 04 08989

(51) Int. Cl.
*H01L 21/00* (2006.01)
(52) U.S. Cl. .................... 438/157; 438/217; 438/514
(58) Field of Classification Search ............. 438/217, 438/157, 514
See application file for complete search history.

(56) References Cited

U.S. PATENT DOCUMENTS

| | | | |
|---|---|---|---|
| 5,374,564 A | 12/1994 | Bruel | |
| 5,659,192 A | 8/1997 | Sarma et al. | |
| 6,069,054 A | 5/2000 | Choi | |
| 6,091,112 A | 7/2000 | Kwon | |
| 6,174,758 B1 | 1/2001 | Nachumovsky | |
| 6,316,332 B1 | 11/2001 | Lo et al. | |
| 6,462,364 B1 * | 10/2002 | Horiuchi | 257/288 |
| 6,646,296 B2 * | 11/2003 | Horiuchi | 257/288 |
| 6,800,513 B2 * | 10/2004 | Horiuchi et al. | 438/157 |
| 2002/0195623 A1 * | 12/2002 | Horiuchi | 257/200 |
| 2003/0089901 A1 | 5/2003 | Fitzgerald | |
| 2003/0113961 A1 * | 6/2003 | Horiuchi et al. | 438/157 |
| 2004/0180521 A1 | 9/2004 | Joly | |
| 2006/0060846 A1 * | 3/2006 | Barbe et al. | 257/49 |

FOREIGN PATENT DOCUMENTS

| | | |
|---|---|---|
| EP | 0 867 922 A2 | 9/1998 |
| EP | 1 045 448 A1 | 10/2000 |
| FR | 2 827 705 | 1/2003 |
| FR | 2 856 841 A1 | 12/2004 |
| JP | 01128570 | 5/1989 |
| JP | 11-233449 | 8/1999 |
| WO | WO 2005001915 | 1/2005 |

OTHER PUBLICATIONS

Wong et al., "Periodic Mass Shedding of a Retracting Solid Film Step," Acta Metallurgica Inc., "Acta mater," 48 (2000), pp. 1719-1728.

* cited by examiner

*Primary Examiner*—Laura M Menz
(74) *Attorney, Agent, or Firm*—Brinks Hofer Gilson & Lione

(57) ABSTRACT

A method is provided for fabricating a thin layer element, in which a layer of a first material supports a pattern of a second material having a thickness of less than 15 nm, including a step of doping by implanting a chemical species over at least a portion of the layer-pattern assembly to stabilize the pattern on the layer.

20 Claims, 7 Drawing Sheets

THIN LAYER ELEMENT AND ASSOCIATED FABRICATION PROCESS

RELATED APPLICATIONS

This application claims priority from French Patent Application No. 0408989 filed Aug. 19, 2004, which is incorporated herein by reference.

TECHNICAL FIELD

The invention relates to a thin layer element and a process for fabricating this kind of element. In particular, the invention relates to a thin layer element for an electronic component.

BACKGROUND

In electronic component fabrication processes, elements are frequently used that consist of a layer made from a first material that supports a pattern made from a second material, for example in the form of a thin layer. This type of structure is seen in particular in the silicon-on-insulator (SOI) technology, as described in patent application FR 2 827 705 for the production of a transistor, for example. In this technique, a buried insulative material layer separates the pattern, which is part of the electronically active portion (for example a transistor), from the solid silicon substrate. During the fabrication of the thin layer element, it may be necessary to increase the thickness of the pattern locally, for example by means of an epitaxial technique. At this stage, the buried layer of insulative material is supporting a thin silicon pattern. To clean this structure, it must be heated to a high temperature to bring about desorption of species.

Applying a high temperature (typically of the order of 850° C.) activates the phenomenon of surface diffusion. If the pattern is very thin (typically about 10 nm thick or even less, which is increasingly the case with the ongoing reduction in the size of microelectronic components), this diffusion can convert the pattern, which is initially in the form of a uniform block, into a set of separate crystals, which correspond to the equilibrium form that minimizes the energy of the system.

This kind of phenomenon, known as agglomeration, is disastrous for the continuation of the fabrication process. Therefore, a need exists for a fabrication process that avoids agglomeration.

BRIEF SUMMARY

In order to address this problem, and thus to propose a solution whereby a thin layer pattern supported by a buried layer may in particular be heated to high temperatures (for example for cleaning by desorption of species), the invention proposes a method of fabricating a thin layer element, in which a layer of a first material supports a pattern of a second material, characterized by a step of doping by implanting a chemical species over at least a portion of the layer-pattern assembly to stabilize the pattern on the layer. The implanted species therefore modify the surface energy of the layer and/or the interface energy between the pattern and the layer. The stabilization applies primarily to the geometry of the pattern.

According to a first solution, the implantation is performed over at least a portion of the layer at the periphery of a support area of the pattern so as to modify the surface properties of the portion. This modifies the contact angles, which makes the pattern stronger. The presence of implanted species in the peripheral regions of the area of the layer that supports the pattern modifies the surface energies of the layer and/or of the interface between the pattern and the layer and therefore the contact angle at thermodynamic equilibrium. This contact angle is also known as Young's angle (referred to as the contact angle in the remainder of the document).

The implantation must allow the Young's angle to be reduced in order to reduce the evolution kinetics of the pattern and to limit agglomeration during annealing, for example for cleaning by desorption of species. If the pattern is supported by a surface of the layer that comprises a region that adjoins and surrounds at least part of the pattern, implantation is performed at least in part on said region, for example. The implantation step can leave essentially unchanged the chemical composition of at least a portion of the area of the layer situated directly under the pattern (pattern support area).

There may also be provided a step of lateral diffusion of the implanted species by annealing, so as to dope the peripheral regions of the pattern support area with the implanted species. This is beneficial in particular if the Young's angle is greater than 90° in the undoped regions, because in this case there is no spreading of the pattern.

The pattern may be covered with a mask during the implantation step. In this case, the method may include a previous step of forming the pattern by photolithographic etching using the mask. Alternatively, the pattern could be transferred to and fastened to the layer by molecular adhesion.

According to a second solution, implantation is performed at least in part in the pattern. This implantation may be, where applicable, compatible with the first solution. The first material may be an insulator, for example a silicon oxide. The second material may be a semiconductor material, for example silicon. Implantation may be carried out to a depth that is typically less than half the thickness of the layer. This thickness is typically less than 50 nm, for example of the order of 10 nm. In this way, surface implantation does not modify the volume properties of the layer concerned. Moreover, implantation may be performed at non-zero incidence, for example from 5° to 45° angle of incidence. The doping then projects slightly under the pattern, with the advantages already mentioned above, such as lateral diffusion.

The doping step may follow a step of producing the pattern. It may equally precede or be contemporaneous with the step of producing the pattern. The pattern generally has a thickness of less than 15 nm in which case the risks of agglomeration referred to above are particularly high. The benefit of the proposed process is increased for very thin patterns, typically less than 10 nm thick, or even less than 5 nm thick.

The process may then include, after the implantation step and a step of producing the pattern, a step of applying a temperature for a given duration, the temperature and the duration leading to agglomeration of other patterns identical to patterns that are supported by other layers identical to the described layer for assemblies that have not been subjected to implantation. This step may be a step of surface preparation for epitaxy, for example.

The invention also proposes a thin layer element including a layer of a first material that supports a pattern of a second material, characterized by a region doped with a chemical species over at least a portion of the layer-pattern assembly so as to stabilize the pattern on the layer.

According to a first solution, this region is in particular over a portion of the surface of the layer at the periphery of a pattern support area so as to modify the surface properties of the layer.

According to a second solution, which may where applicable be compatible with the first solution, said region is at least in part in the pattern. Moreover, the element may have features analogous to those of the process referred to above, with the ensuing advantages.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF SEVERAL VIEWS OF THE DRAWINGS

The invention can be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION

Figure 1:
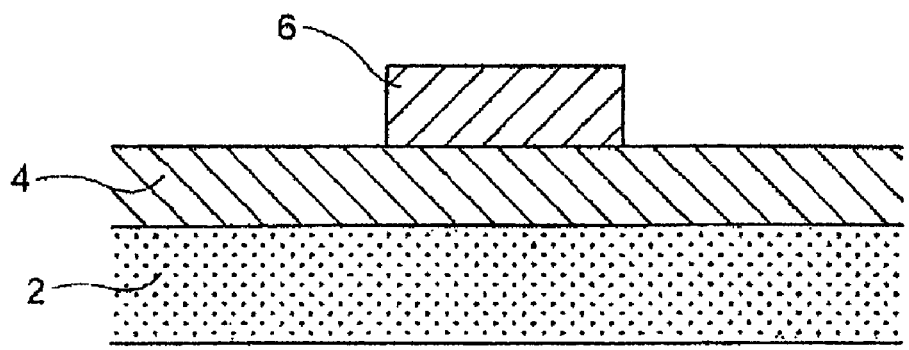
FIG. 1 illustrates fabricating a thin layer element.

FIG. 1 represents a thin layer element at the stage of its fabrication process in which it includes a composite continuous insulative material lower layer 2 covered by a continuous semiconductor material layer 4. The insulative material layer 2 is therefore referred to as a buried layer.

The buried layer is a layer of silicon oxide (SiO2), for example, in which case it is referred to as a BOX (Buried OXide) layer. The semiconductor layer 4 is a layer of silicon (Si), for example.

This structure is the basic structure of the silicon-on-insulator (SOI) technology. It may be obtained by the process described in U.S. Pat. No. 5,374,564. The silicon layer 4 forms the active microelectronic elements of the electronic component after appropriate processing.

The oxide layer 2 insulates these active elements from the solid silicon substrate, which carries the structure previously described. As already indicated above, at the stage of the process represented in FIG. 1, the silicon layer 4 is continuous. A mask 6, consisting of a double layer of silicon oxide (SiO2) and silicon nitride, for example, the SiO2 being in contact with the silicon pattern, is deposited on the upper face of the silicon layer 4 to define the shape of a pattern by photolithographic etching.

Figure 2:
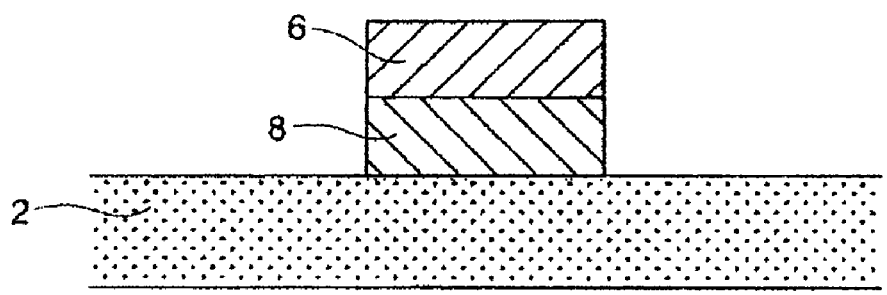
FIG. 2 illustrates fabricating a thin layer element after a photolithographic etching step.

FIG. 2 represents the FIG. 1 thin layer structure after the photolithographic etching step. The buried layer 2 is not modified by this process step, whereas the silicon layer 4 is eliminated, except where it was covered by the mask 6. The buried layer 2 therefore may support a thin layer silicon pattern 8, which at this stage may still be covered by the mask 6.

Figure 3:
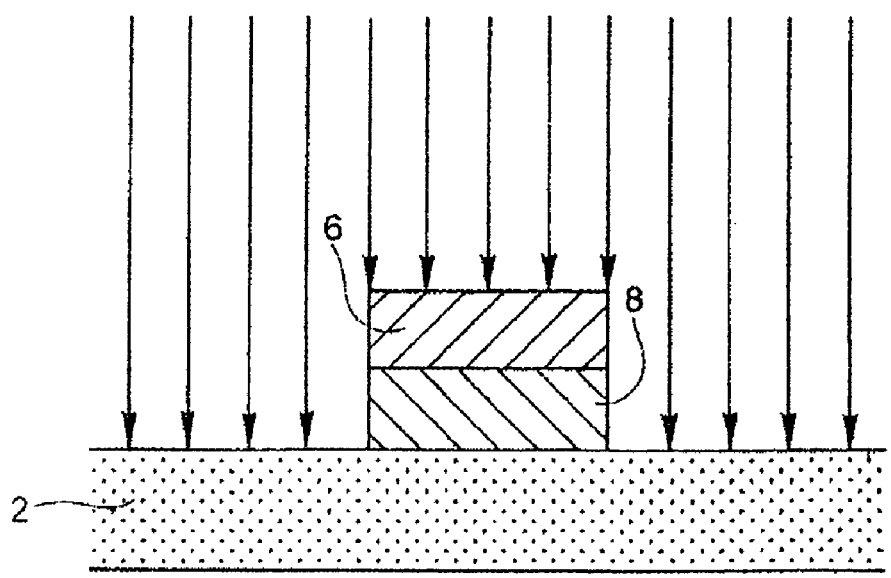
FIG. 3 illustrates an implantation in fabricating a thin layer element.

As shown in FIG. 3, the structure obtained in this way is then subjected to a step of implanting chemical species, such as atoms of arsenic (As) or phosphorus (P). Alternatively, molecules could be implanted, such as boron difluoride (BF2) molecules. The species may be implanted in ionic form. The implanted species must contribute to reducing the contact angle between the pattern and its support. If these ions must have an electrical role afterwards, it is beneficial to implant these electron donors or acceptors, which are respectively to the right and to the left of silicon in the periodic table of the elements.

The implantation parameters are selected so that implantation affects only the surface of the FIG. 2 thin layer element. For example, if the buried layer 2 has a thickness of the order of 100 nm, implantation is performed to a typical depth of the order of 10 nm.

Figure 4:
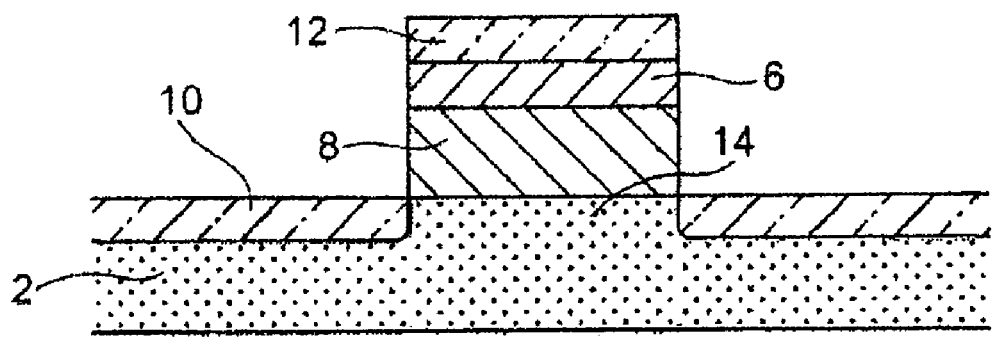
FIG. 4 illustrates a thin layer element after the implantation of FIG. 3.

As shown in FIG. 4, after implantation, the surface chemical composition of the materials that form the structure represented in FIG. 2 has therefore been modified. In particular, regions on the upper surface of the buried layer 2 are doped by the implanted chemical species, at least at the periphery of the area 14 of the buried layer 2 directly under the thin layer pattern 8 (the area 14 is called the support area hereinafter). A surface layer 10, doped with the implanted chemical species, is therefore formed in regions of the upper surface of the buried layer 2 that adjoin and surround the thin layer pattern 8. This doping modifies the surface properties, and in particular the interface energy between the buried layer 2 and the thin pattern 8, which modifies the contact angle between the thin film 8 and the buried layer 2. This contact angle is conventionally called the Young's angle.

To encourage lateral diffusion of the implanted species under the pattern, heat treatment is advantageously applied, for example at 950° for 2 minutes, as described below. The person skilled in the art may modify the time and the temperature of this annealing treatment to obtain the required expansion. As shown in FIG. 4, the mask is also implanted. However, in the present example, implantation is carried out in such a way that it does not pass through the mask 6, so that the thin layer pattern 8 is not affected or only very slightly affected by the implantation.

Figure 6:
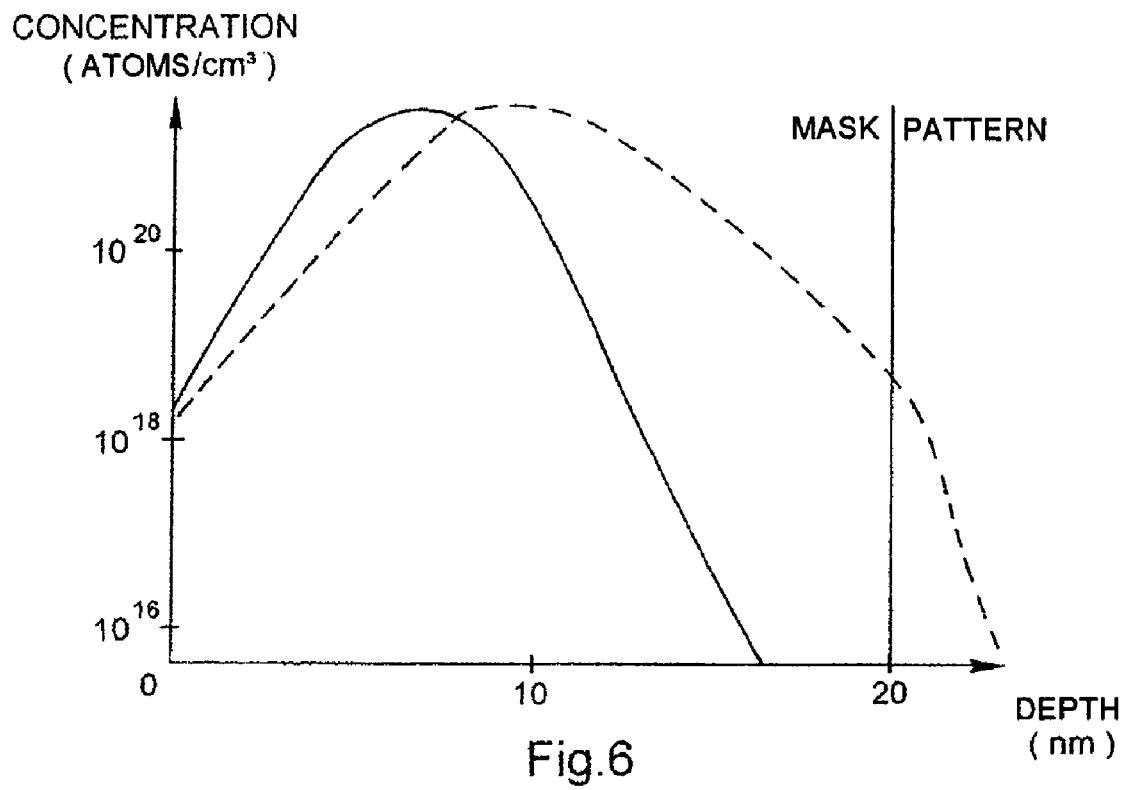
FIG. 6 illustrates implanted species concentration profiles in the mask.
Figure 7:
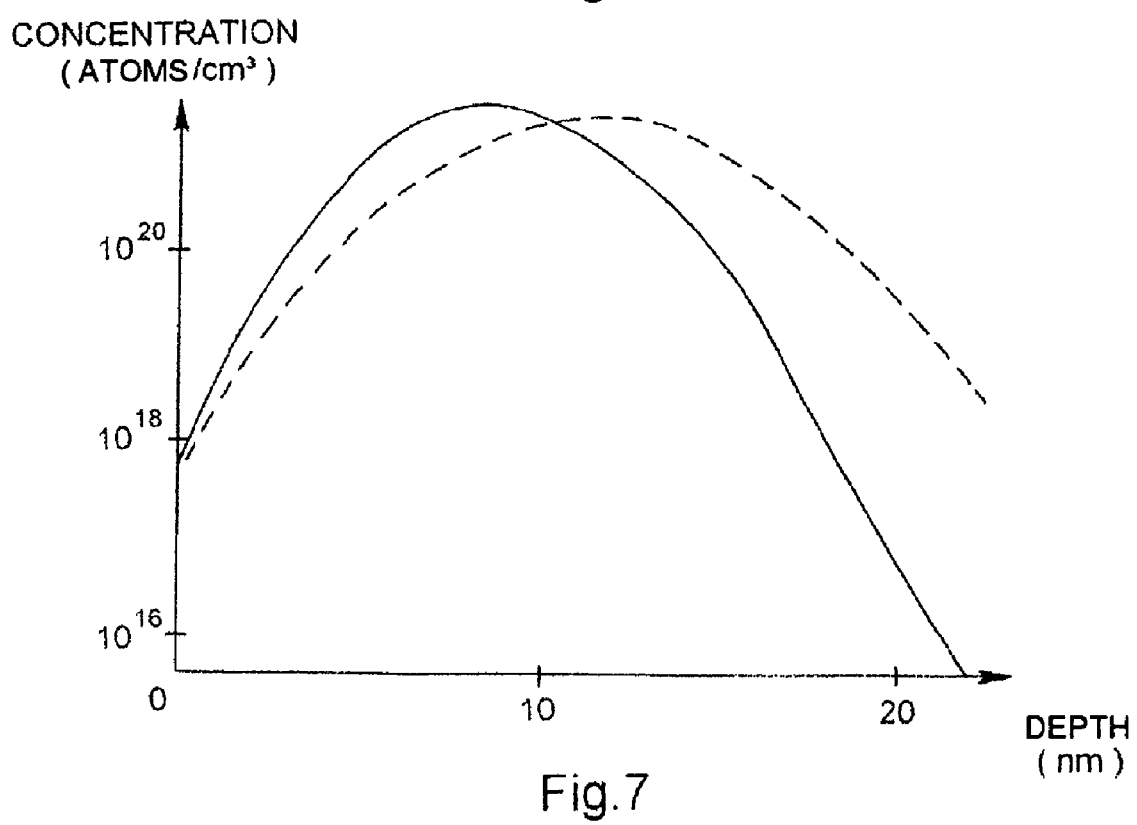
FIG. 7 illustrates implanted species concentration profiles in the buried layer.

FIGS. 6 and 7 are examples of implanted species concentration profiles obtained by means of the step just described. FIG. 6 represents the arsenic concentration profile in the depth of the mask 6 and the pattern 8. The depth in nanometers relative to the upper (free) surface of the mask 6 is plotted on the abscissa of the FIG. 6 graph. Since the mask 6 has a thickness of 20 nm in the present example, abscissa values from 0 to 20 represent points situated within the mask, while abscissa values greater than 20 correspond to points situated in the pattern 8. The concentration in atoms per cm3 is plotted on the ordinate on a logarithmic scale.

The continuous line shows the concentration profile obtained by implanting arsenic (As) with an energy of 5 keV and the dashed line shows the concentration profile for an energy of 10 keV, again in the case of arsenic (As). As seen in FIG. 6, in both cases (5 keV and 10 keV), the depths of implantation of the arsenic (As) are of the order of 10 nm.

In the first case (5 keV energy), the typical implantation depth (i.e. the depth at which the highest concentration of the implanted species is generated by implantation) is slightly less than 10 nm and the concentration of atoms of arsenic (As) falls off sharply beyond 10 nm, so that the concentration of As is negligible at the mask-pattern interface, and therefore also negligible inside the pattern 8. In the second case (10 keV energy), the typical implantation depth is slightly greater than 10 nm and the concentration of atoms of arsenic at the mask-pattern interface is of the same order as that observed on the upper face of the mask. Consequently, in this case, the pattern is subject to slight but not negligible implantation, as may be seen clearly in FIG. 6.

Implantation of the type obtained above with an energy of 5 keV is used if it is desired to obtain implantation, of the chemical species into the pattern. For example, in the case of a transistor for which the channel is not doped (so-called intrinsic doping corresponding to the natural concentration of carriers), the access areas (source and drain) may be N-doped (NMOS) or P-doped (PMOS).

Implantation of the pattern is not harmful in all cases, as explained in more detail below with reference to the second embodiment. FIG. 7 represents the profile of the concentration of atoms of arsenic (As) in the buried layer 2. The depth in the buried layer 2 relative to the upper surface of the buried layer 2 that is implanted is plotted on the abscissa. As in FIG. 6, the concentration of atoms of arsenic per cm3 is plotted on the ordinate.

If a 5 keV implantation energy is used (continuous line in FIG. 7), the typical depth of implantation is slightly less than 10 nm. Note that this typical depth is slightly greater than the depth of implantation obtained with the same energy in the nitride mask 6. In the case of a 10 keV energy (dashed line in FIG. 7), the depth of implantation is of the order of 15 nm.

When implantation is completed, there may follow an annealing step to ensure lateral diffusion of the implanted species into the buried layer 2. This results in doping of the peripheral regions 16 of the area 14 that supports the pattern 8, as shown in dashed line in FIG. 5. Note, however, that this diffusion is not always necessary, in particular if the Young's angle is less than 90°. This result occurs because, in this case, the base of the etching begins by spreading laterally. If the etching base reaches a doped area whose angle is suitable, the agglomeration kinetics of the film are modified in the manner of the invention.

Figure 5:
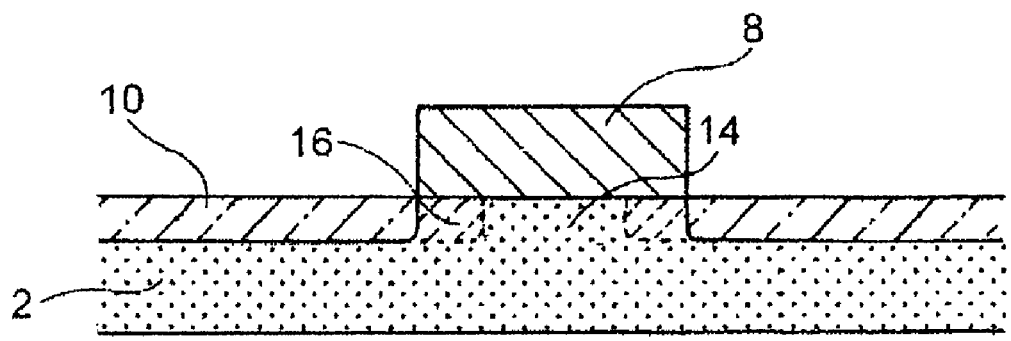
FIG. 5 illustrates a thin layer element after annealing.

In a conventional way, the mask 6 used for applying the thin layer structure is eliminated in a subsequent step, following which the electronic component element has the following structure, represented in FIG. 5:
 a continuous buried layer 2, of silicon oxide in this example, the upper surface of which includes regions 10 surface doped by implantation, and
 a thin layer pattern 8, of silicon in this example, supported by the buried layer 2 in the support area 14 whose central portion has not been subjected to implantation and whose peripheral region 16 may be doped if the annealing step is carried out.

Because the doped regions 10 are situated in particular at the periphery of the support area 14 of the thin layer pattern 8, it is as if the latter were retained in an energy well due to the modification of the contact angles previously referred to. Therefore, the speed of dewetting between the thin pattern 8 and the buried layer 2 is significantly reduced. This increases the anchorage energy of the thin pattern 8.

The structure represented in FIG. 5 and obtained by the process of the invention may therefore be heated to high temperatures, for example, for cleaning by desorption, without risk of destruction of the pattern 8 by surface diffusion. For example, the structure could be subjected to surface preparation for epitaxy by annealing in an atmosphere containing hydrogen, typically at 850° C. for 10 minutes. Moreover, because of the depth of implantation used, which is typically of the order of 10 nm, compared to a typical thickness of the buried layer of 100 nm, only the surface properties of the buried layer 2 are modified by implantation. The buried layer 2 volume properties (in particular, here, the insulation provided by the buried layer 2) are not modified. Accordingly, although implantation causes the pattern 8 to adhere to the buried layer 2, it does not affect the advantages that this structure conventionally provides.

Figure 8:
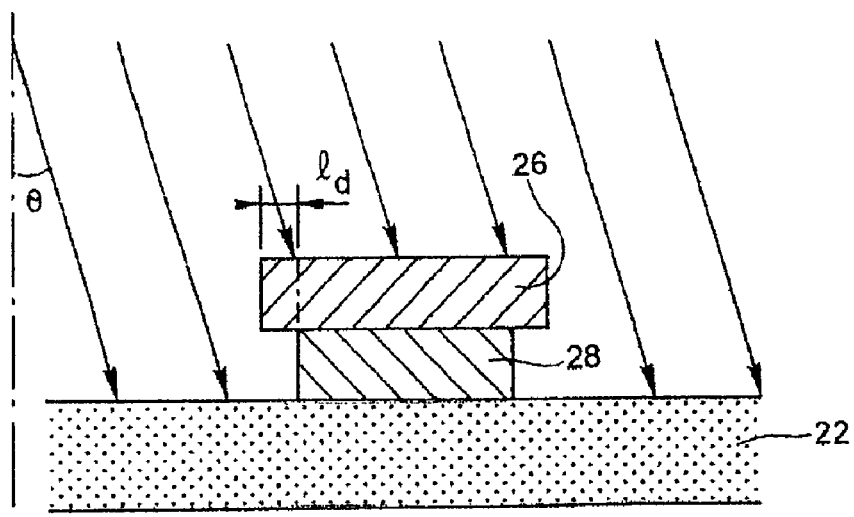
FIG. 8 illustrates an implantation of a thin layer element at a non-zero angle of incidence.
Figure 9:
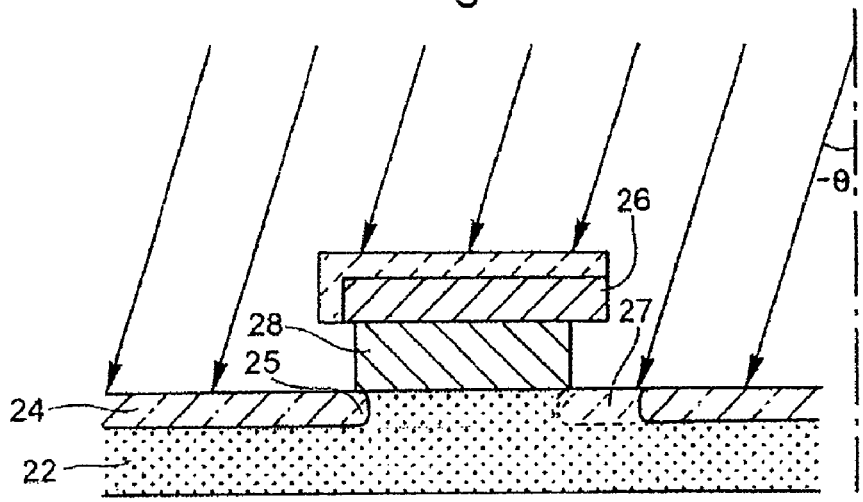
FIG. 9 illustrates the implantation of FIG. 8 where the wafer is pivoted during implantation.

FIGS. 8 and 9 represent a variant of the process described above with reference to FIGS. 1 to 5 in which implantation is carried out with a non-zero angle of incidence θ, for example an angle of incidence of 7°. An angle of incidence from 0° to 45° is generally selected. It will be shown that using a non-zero angle of incidence achieves implantation not only in the regions of the surface of the buried layer 2 that surround and adjoin the pattern 8 but also in the peripheral regions 25 of the area of the buried layer 2 that supports the pattern (pattern support area), without requiring additional annealing, as previously referred to, although such annealing may be performed.

According to this first variant, the mask 26 may project laterally relative to the thin layer pattern 28 supported by the insulative buried layer 22 so that the mask 26 protects the pattern 28 from implantation at incidence θ. Such projection of the mask 26 is of particular benefit if it is required to prevent doping of the pattern 28 by the implanted chemical species, as in the case of the undoped channel transistor already referred to. To protect the pattern 28 correctly, the mask 26 must project relative thereto by a distance $I_d$ at least equal to $L_p \cdot \sin\theta + t_{si} \cdot \tan\theta$, where $L_p$ is the typical depth of implantation and $t_{Si}$ is the thickness of the pattern.

If the implantation employs a parallel beam of ions at an incidence θ, as shown in FIG. 8, there are formed on the upper surface of the buried layer 22 regions 24 doped with the implanted chemical species, not only on the free surface of the buried layer 22 but also in the peripheral regions 25 of the area of the buried layer 22 directly under the thin layer pattern 28, as shown in FIG. 9. This kind of implantation improves tolerance of subsequent steps of fabrication processes that consume part of the thin layer pattern support layer.

As may be seen in FIG. 9, implantation at a given non-zero angle of incidence θ causes a lack of symmetry of the doped regions (represented in solid line), which is why it is preferable also to provide, as shown in FIG. 9, a step of implantation at the same incidence, but with the wafer pivoted as many times as necessary. A person skilled in the art conventionally opts for four rotations by 90°. As may be seen in FIG. 9, this new step completes the implantations of the free surface of the buried layer 22, in particular in the portions 27 thereof (represented in dashed line) that were sheltered by the mask 26 during implantation at incidence θ.

The benefit of this step of symmetrical projection of the mask 26 relative to the pattern 28 is that it protects the lateral wall of the pattern 28 that, without the projection, would be subjected to implantation at non-zero incidence. Other sides of the pattern 28 that are not shown in FIGS. 8 and 9 may also each necessitate implantation with a different orientation (which is nevertheless always at an angle θ to the normal to the buried layer 22).

Figure 10:
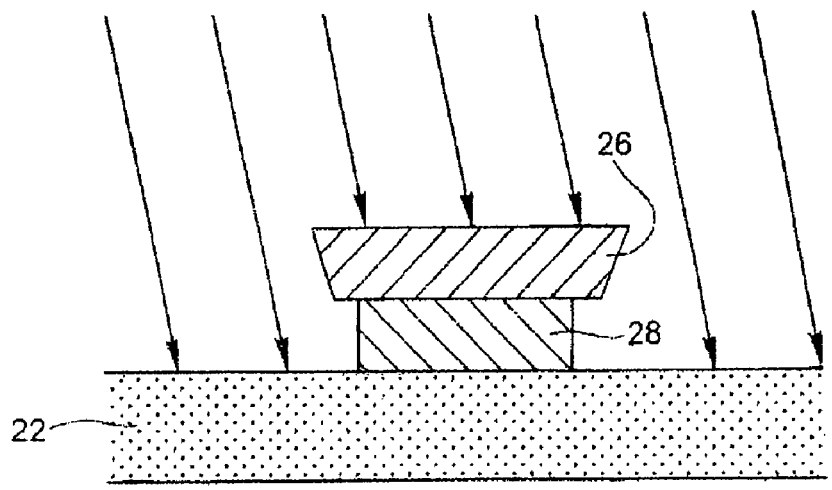
FIG. 10 illustrates the implantation of FIG. 8 where the flanks of a mask are be inclined at an angle.

The projection of the mask 26 may take a different form to that shown in FIG. 8. For example, the flanks of the mask 26 may be inclined at an angle equal to (or in practice close to) the implantation angle θ, as shown in FIG. 10. This solution is advantageous in particular because it avoids shadowing phenomena.

Figure 11:
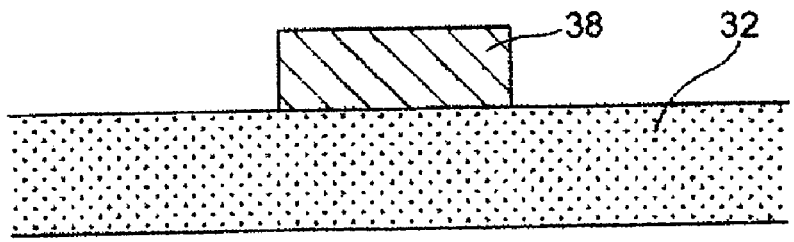
FIG. 11 illustrates a thin layer element with a buried layer supporting a pattern with a free upper surface.
Figure 12:
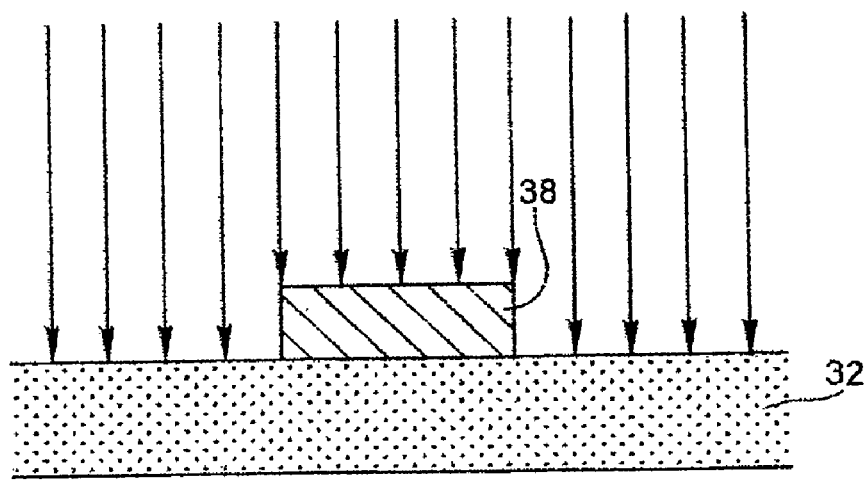
FIG. 12 illustrates an implantation performed on the thin layer element illustrated in FIG. 11.
Figure 13:
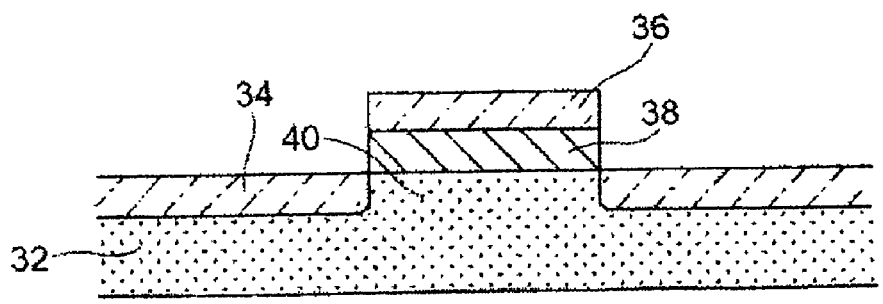
FIG. 13 illustrates a thin layer element with surface regions doped with implanted species.

A second embodiment of the invention is described next with reference to FIGS. 11 to 13. This second embodiment relates to a thin layer element in which a buried layer 32 supports on its upper surface a pattern 38 whose upper surface is free (as shown in FIG. 11), or covered with a thin oxide, for example a 20 Å (2 nm) oxide deposit. One function of this thin oxide is to limit damage caused by subsequent ionic bombardment.

This kind of structure is obtained by photolithographic etching, for example. To this end, it is possible in particular to use a process with steps identical to those represented in FIGS. 1 and 2 of the first embodiment, followed by a step of eliminating the mask (without carrying out the implantation step at this stage, in contrast to the first embodiment). There then follows a step of implanting a chemical species, for example atoms of arsenic, as shown diagrammatically in FIG. 12. The implantation parameters are such that the implantation primarily modifies the chemical composition of the surface layers of the buried layer 32. This is obtained if the typical depth of implantation is much less than the thickness of the buried layer 32, for example.

As indicated above, the upper surface of the thin pattern 38 is free, and consequently is also subjected to implantation, with a depth proportional to the density of the implanted material. For a silicon oxide (SiO2) support and a silicon pattern, the implantation depths are therefore substantially the same, neglecting any channeling effects that may occur in the silicon if the rows of silicon atoms are parallel to the implantation direction. Nevertheless, it is advantageous if the thickness of the thin pattern 38 is less than the thickness of the buried layer 32. This condition allows selection of an implantation depth enabling doping with the implanted species of the surface layers only of the buried layer 32, but, on the other hand, of a substantial portion (in terms of depth in particular) of the thin layer pattern 36.

Note further that the implantation depth is advantageously less than the thickness of the thin layer pattern 36 so that the area of the buried layer 32 directly under the thin pattern 36 is not affected, or in any event not significantly affected, by the implantation.

The implantation that has just been described produces a thin layer element in which the buried layer 32 has surface regions 34 doped with the implanted species except in the area 40 of the surface of the buried layer 32 directly under the thin pattern 38 in which the thin pattern 38 is itself doped, at least in significant portions 36, with the implanted species. A buried portion of the thin pattern 38 that has not undergone implantation remains crystalline. If necessary, during subsequent appropriate heat treatment, this buried portion may serve as a recrystallization seed for the upper portion of the pattern that is rendered amorphous by the implantation.

Due to the presence of these implanted regions 34, 36, as much on the surface of the buried layer 32 as within the thin layer pattern 38, the following two physical phenomena can work together to prevent dewetting of the thin pattern 38:

modification of the surface energies of the buried layer 32 in the regions 34 thereof that do not carry the thin pattern 38, so as to modify the contact angles (in a similar manner to the effect produced in the first embodiment); and reduction of the speed of diffusion at the surface of the thin layer 38 by the doping of at least a significant portion 36 thereof.

The above two phenomena combine to keep the thin pattern in the form of a compact mass, especially if the thin layer element is heated to high temperatures, for example for cleaning by desorption. As is apparent, the combined application of the above two phenomena nevertheless implies that the doping of the thin pattern 38 does not cause problems in subsequent use of the thin layer element obtained in this way. This is why the second embodiment is used, for example, in situations where the thin pattern must not provide any electrical function but rather only a mechanical function.

Figure 14:
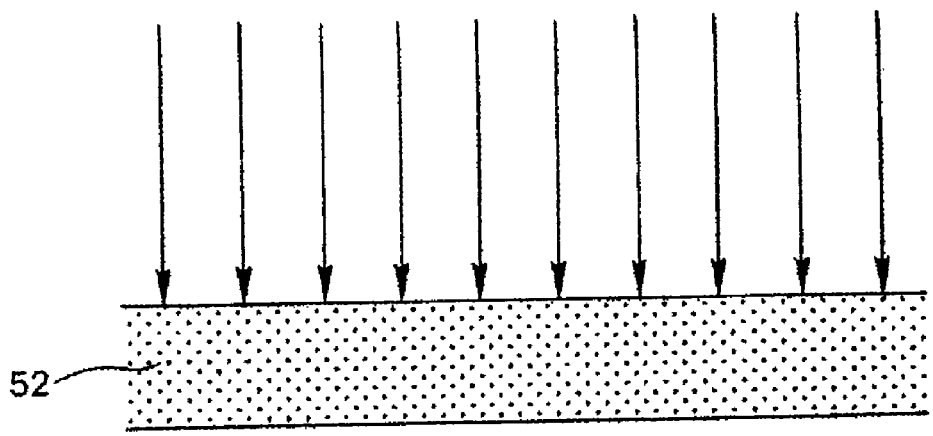
FIG. 14 illustrates an implantation of a surface.
Figure 15:
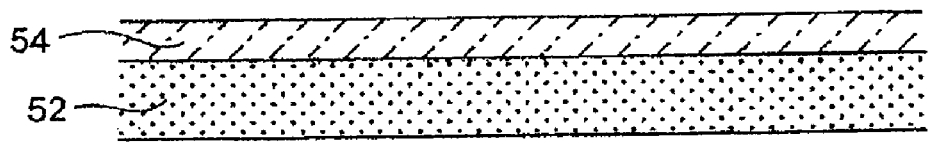
FIG. 15 illustrates a surface of a thin layer element after the implantation of FIG. 14.
Figure 16:
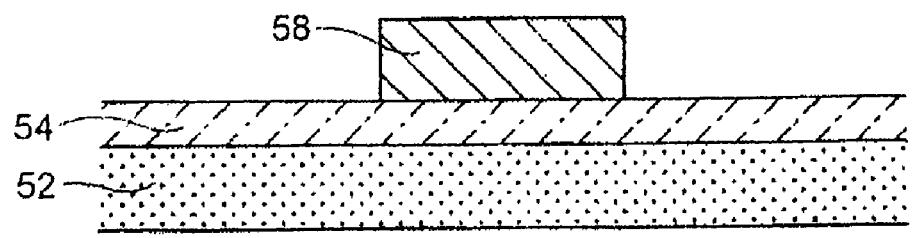
FIG. 16 illustrates a thin layer element with a pattern.

In another embodiment, examples of which will be given below, implantation may be carried out before the layer-pattern structure is constituted. FIGS. 14 to 16 show a third embodiment of the invention that uses this feature. In this embodiment, a layer 52 of silicon oxide (SiO2) undergoes implantation with a chemical species (for example arsenic) as shown diagrammatically in FIG. 14. After implantation, the layer therefore has the overall profile represented in FIG. 15, that is, a surface region 54 of the layer 52 that has undergone implantation and is therefore doped with the chemical species, while the buried regions of the layer 52 have not been significantly affected by the implantation.

The layer-pattern structure is then produced, for example, by forming the pattern 58 by a method analogous to that represented in FIGS. 1 and 2, or alternatively by individual or collective transfer of patterns onto the implanted surface, for example using molecular bonding. Due to the doping of the surface regions 54 of the layer 52 with the implanted species that was carried out beforehand, the surface energies at the layer-pattern interface are modified to encourage retention of the pattern 58 on the layer 52 as shown in FIG. 16. Note that this embodiment makes it relatively easy to dope the insulative layer by implantation of species, in particular because the pattern is not present during implantation. This solution also means that the supplier of the layer 52 can carry out the implantation if the supplier is not also the fabricator of the layer-pattern structure.

This solution nevertheless implies that the whole of the surface of the layer 52 is implanted, including the pattern support area in its entirety, which may not suit certain applications. For example, there may be the risk of loss of the insulative nature of the layer 52 under the pattern 58.

Figure 17:
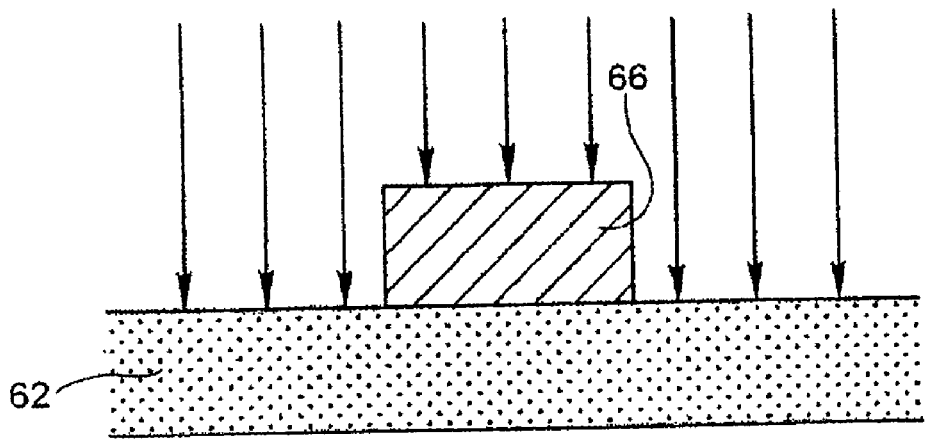
FIG. 17 illustrates an implantation step for a thin layer element.
Figure 18:
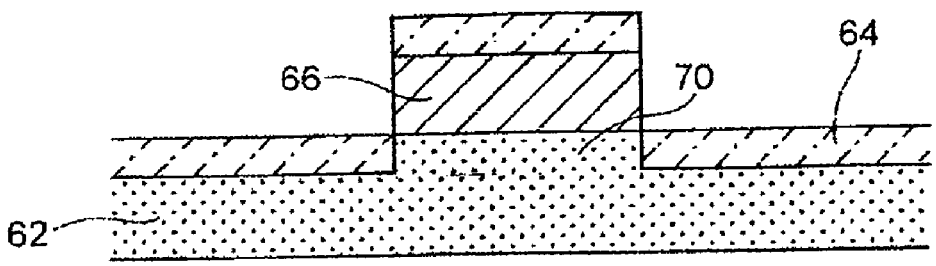
FIG. 18 illustrates the results of the implantation of FIG. 17.
Figure 19:
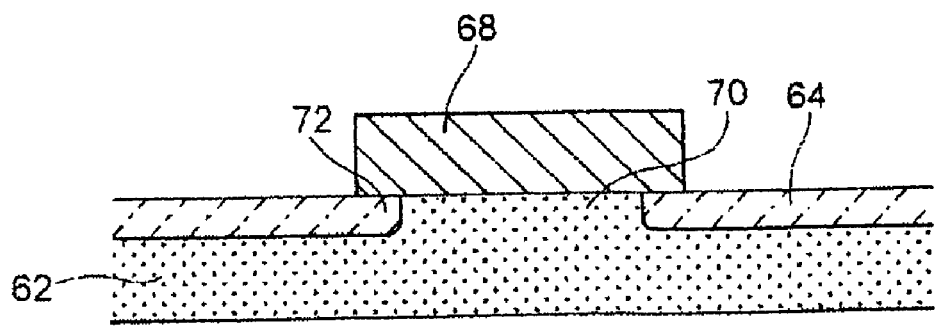
FIG. 19 illustrates a thin layer element after a thin pattern deposition.

FIGS. 17 to 19 show a fourth embodiment of the invention. In this embodiment, an insulative layer 62 is provided with a mask 66 over a portion of its surface and is subjected to implantation of species (for example of arsenic), as shown in FIG. 17. This step dopes a region 64 on the surface of the layer 62 with implanted species, outside the area 70 of the layer 62 that supports the mask 66, as shown in FIG. 18. The thickness of the mask 66 and the typical implantation depth are such that the implantation does not significantly pass through the mask 66 and leaves unchanged the chemical composition of an area 70 under the mask 66.

The mask 66 may then be eliminated, followed by the deposition of a thin pattern 68, as shown in FIG. 19. As indicated above, the thin pattern 68 may be produced by photolithographic etching or by using a molecular adhesion process. Note that, in the FIG. 19 example, the width of the thin pattern 68 is greater than the width of the mask 66 used during implantation, so that peripheral regions 72 of the area of the layer 62 that supports the pattern 68 have undergone implantation and are therefore doped. The pattern could instead be slightly inside the area 70, in particular if the Young's angle is less than 90°. As in the above examples, this doping modifies the contact angle between the pattern 68 and the buried layer 62 to stabilize the pattern 68 on the layer 62. The implantation must allow the Young's angle to be reduced in order to reduce the evolution kinetics of the pattern and to limit agglomeration during annealing, for example for cleaning by desorption of species. If the pattern is supported by a surface of the layer that comprises a region that adjoins and surrounds at least part of the pattern, implantation is performed at least in part on said region, for example. The implantation step can leave essentially unchanged the chemical composition of at least a portion of the area of the layer situated directly under the pattern (the pattern support area).

In the examples described above, implantation is performed before or after producing the layer-pattern structure. Implantation with the chemical species could instead be carried out contemporaneously with the constitution of the layer-pattern structure.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

What is claimed is:

1. A method of fabricating a thin layer element comprising:
    forming an assembly comprising a first material layer and a pattern of a second material, the pattern having a thickness of less than 15 nm, and wherein the pattern is supported by the first material layer; and
    implanting a chemical species into at least a portion of the assembly to reduce the contact angle between the first material layer and the pattern to stabilize the pattern on the first material layer.

2. A method according to claim 1, wherein implanting the chemical species comprises implanting into at least a portion of the first material layer at a periphery of a support area of the pattern so as to modify the surface properties of said portion.

3. A method according to claim 2, wherein the pattern is supported by a surface of the first material layer, the surface comprising a region that adjoins and surrounds at least part of the pattern, and wherein implanting the chemical species is carried out in at least a portion of the region.

4. A method according to claim 3, wherein implanting the chemical species leaves essentially unchanged a chemical composition of at least a portion of the support area of the first material layer directly under the pattern.

5. A method according to claim 4 further comprising laterally diffusing the implanted chemical species by annealing.

6. A method according to claim 5 further comprising covering the pattern with a mask during implanting the chemical species.

7. A method according to claim 6, further comprising forming the pattern by photolithographic etching using the mask.

8. A method according to claim 1, wherein implanting the chemical species comprises implanting at least in part into the pattern.

9. A method according to claim 1, wherein the first material layer comprises an insulator.

10. A method according to claims 1, wherein the first material layer comprises a silicon oxide.

11. A method according to claim 10, wherein the pattern comprises a semiconductor material.

12. A method according to claim 10, wherein the pattern comprises silicon.

13. A method according to claim 8, wherein implanting the chemical species comprises implanting to a depth less than 50 nm.

14. A method according to claim 13, wherein implanting the chemical species comprises implanting at a non-zero angle of incidence.

15. A method according to claim 14 wherein the angle of incidence comprises 5° to 45°.

16. A method according to claim 1, wherein implanting the chemical species is carried out after producing the pattern.

17. A method according to claim 15 wherein implanting the chemical species precedes forming the pattern.

18. A method according to claim 1 wherein implanting the chemical species is contemporaneous with forming the pattern.

19. A method according to claim 1 further comprising after implanting the chemical species, applying a temperature for a given time, wherein the temperature and the time are sufficient to at least partially diffuse the chemical species in the first material layer beneath the pattern.

20. A method according to claim 1 further comprising annealing the pattern, and wherein implanting the chemical species reduces agglomeration of the pattern during annealing.

* * * * *